(12) United States Patent
McIlwain et al.

(10) Patent No.: US 10,643,012 B1
(45) Date of Patent: May 5, 2020

(54) CONCURRENT FORMAL VERIFICATION OF LOGIC SYNTHESIS

(71) Applicant: Synopsys, Inc., Mountain View, CA (US)

(72) Inventors: Lisa R. McIlwain, Oregon City, OR (US); Michael S. Quayle, Carlisle, MA (US); Eyal Odiz, Los Altos Hill, CA (US); Patrick Groeneveld, Saratoga, CA (US); John W. Hagerman, Boxford, MA (US); Kshama Jambhekar, Acton, MA (US); Phillip W. Baraona, Somerville, MA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/264,091

(22) Filed: Jan. 31, 2019

(51) Int. Cl.
*G06F 9/455* (2018.01)
*G06F 17/50* (2006.01)
*G06F 30/327* (2020.01)
*G06F 30/3323* (2020.01)

(52) U.S. Cl.
CPC ........ *G06F 30/327* (2020.01); *G06F 30/3323* (2020.01)

(58) Field of Classification Search
CPC ...... G06F 30/3323; G06F 30/33; G06F 30/30; G06F 30/398; G06F 2119/06; G06F 30/367; G06F 30/39; G06F 2111/20; G06F 30/327; G06F 30/36; G06F 30/396; G06F 9/455; G01R 31/2848; G01R 31/318364
USPC .......................... 716/104, 106, 108, 111, 51
See application file for complete search history.

(56) References Cited

U.S. PATENT DOCUMENTS

| | | | | |
|---|---|---|---|---|
| 6,321,173 B1* | 11/2001 | Foster | ................. | G06F 30/3323 702/109 |
| 6,848,084 B1* | 1/2005 | Pandey | ................... | G06F 30/33 716/107 |
| 2005/0055612 A1* | 3/2005 | Yamada | ........... | G01R 31/31858 714/724 |
| 2011/0276934 A1* | 11/2011 | Koelbl | ................ | G06F 30/3323 716/108 |
| 2014/0129998 A1* | 5/2014 | Shrivastava | ........ | G06F 30/3323 716/103 |
| 2014/0270050 A1* | 9/2014 | Wang | ...................... | G06F 30/30 377/67 |

* cited by examiner

*Primary Examiner* — Brian Ngo
(74) *Attorney, Agent, or Firm* — Park, Vaughan, Fleming & Dowler LLP; Laxman Sahasrabuddhe

(57) ABSTRACT

Techniques and systems for concurrent formal verification of logic synthesis are described. A synthesis tool can write intermediate checkpoint designs that embody the state of an integrated circuit (IC) design under synthesis as optimization progresses. Meanwhile, formal equivalence checking proceeds in parallel with synthesis and checks the intermediate checkpoint designs for equivalence.

21 Claims, 3 Drawing Sheets

CONCURRENT FORMAL VERIFICATION OF LOGIC SYNTHESIS

BACKGROUND

Technical Field

This disclosure relates to formal verification. More specifically, this disclosure relates to concurrent formal verification of logic synthesis.

Related Art

The importance of verification in integrated circuit (IC) design cannot be over-emphasized. It would be highly risky to use IC designs in mission-critical devices and applications if the IC designs had not been thoroughly verified. One approach for verifying an IC design involves simulating the IC design. However, this approach cannot provide any guarantees regarding the behavior of the IC design because it is computationally infeasible (and often impossible) to exhaustively simulate non-trivial IC designs. Another approach is to use formal verification to mathematically prove that the IC design will operate correctly.

An important problem in the area of formal verification involves equivalence checking between two or more circuit designs that are specified at the same or different abstraction levels. For example, equivalence checking can be performed between two register transfer level (RTL) designs or between an RTL design and a netlist that is produced by synthesizing the RTL design.

FIGS. 1A and 1B illustrate how equivalence checking is performed in existing approaches. As shown in FIG. 1A, RTL design 102 can be synthesized to obtain netlist 104. Specifically, as shown in FIG. 1B, RTL design 102 can be provided to synthesis tool 106 which can produce netlist 104. Synthesis tool 106 can perform numerous transformations and optimizations on RTL design 102 during synthesis. It is important to check if netlist 104 is functionally equivalent to RTL design 102. This can be accomplished by providing RTL design 102 and netlist 104 to equivalence checking tool 108. Equivalence checking tool 108 can formally verify whether or not RTL design 102 is functionally equivalent to netlist 104. If the equivalency check succeeds, then subsequent IC design flow operations can be performed on netlist 104. If the equivalency check fails, then the failure can be reported, and an IC designer can take corrective actions.

Unfortunately, existing formal verification tools can take a long time to check equivalence of an RTL design with a corresponding netlist. Moreover, the synthesis and the formal equivalence checking steps need to be performed every time formal equivalence checking fails, which can significantly increase the overall IC design cycle time. Hence, what are needed are techniques and systems to efficiently perform formal equivalence checking without the above-described problems.

SUMMARY

Some embodiments described herein provide techniques and systems for concurrently performing formal verification during logic synthesis. A synthesis tool executing on a computer can synthesize a netlist design $d_n$ based on an RTL design $d_0$ of an IC. While synthesizing the netlist design $d_n$, the synthesis tool can output a sequence of intermediate checkpoint designs $d_1, d_2, \ldots, d_{n-1}$. A formal verification engine executing concurrently with the synthesis tool on the same computer or a different computer can check equivalence between designs $d_i$ and $d_j$, where $0 \le i < j \le n$.

In some embodiments, an intermediate checkpoint design is a structural netlist that is not completely mapped to a specific technology library. In some embodiments, the intermediate checkpoint design can refer to a generic technology library model. In some embodiments, the intermediate checkpoint design includes at least one unimplemented RTL operator block. In some embodiments, the intermediate checkpoint design includes at least one generic sequential primitive.

In some embodiments, outputting the sequence of intermediate checkpoint designs comprises copying forward at least one of: metadata, real data, and user setup data. In some embodiments, the metadata comprises expression strings defining word-level functions of arithmetic operators. In some embodiments, the metadata comprises data-flow graphs specifying operators and connectivity. In some embodiments, the real data comprises a second implementation of an operator that replaced a first implementation of the operator, wherein the second implementation requires less computation to check equivalence than the first implementation. In some embodiments, the user setup data includes a user command to force a particular signal in the design to a constant value.

DETAILED DESCRIPTION

Figure 1A:
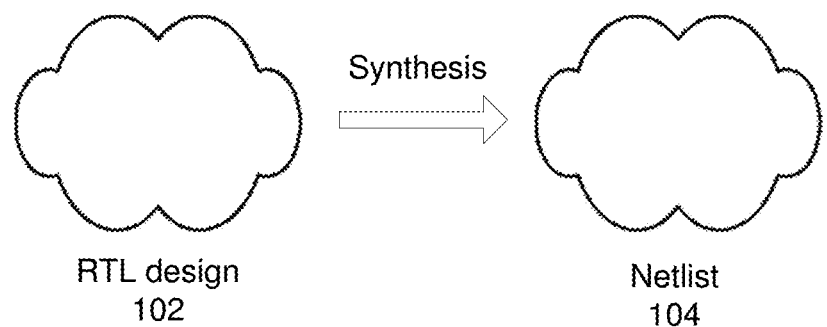
FIGS. 1A and 1B illustrate how equivalence checking is performed in existing approaches.
Figure 1B:
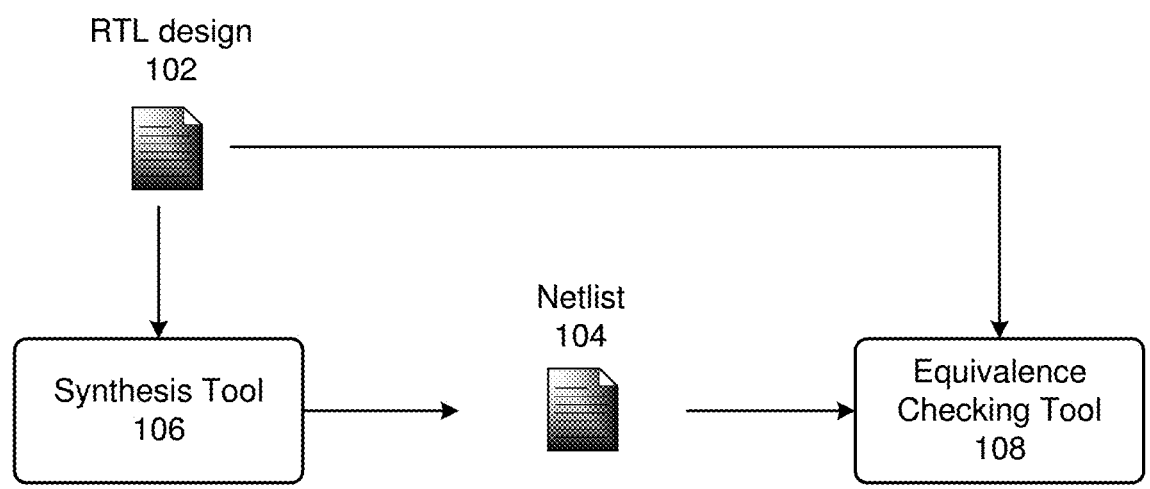

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview of IC Design and Manufacturing

An IC design and manufacturing process produces IC chips. IC design software tools can be used to create an IC design. Once the IC design is finalized, it can undergo fabrication, packaging, and assembly to produce IC chips. The overall IC design and manufacturing process can involve multiple entities, e.g., one company may create the software for designing ICs, another company may use the software to create the IC design, and yet another company may manufacture IC chips based on the IC design. An IC design flow can include multiple steps, and each step can involve using one or more IC design software tools. An improvement to one or more of these steps in the IC design flow results in an improvement to the overall IC design and manufacturing process. Specifically, the improved IC design and manufacturing process can produce IC chips with a shorter time-to-market (TTM) and/or higher quality of results (QoR).

An IC design can be represented by using different data formats or languages as the IC design progresses through an IC design flow, wherein the different data formats or languages represent the IC design at different levels of abstraction. In general, higher levels of abstraction contain fewer details of the IC design than lower levels of abstraction. Typically, the IC design is described at a high level of abstraction in the early stages of the IC design flow, and the level of abstraction becomes progressively lower as the IC design moves through the IC design flow (the description of the IC design becomes more specific as the IC design progresses through the IC design flow).

For example, toward the beginning of the IC design flow, an IC design can be described at a high level of abstraction by using a hardware description language (HDL) which describes the functionality of the IC design but does not include information about the actual geometric shapes that will be printed on the wafer. Toward the end of the IC design flow, the same IC design can be represented in a low level of abstraction by using a data format or language such as GDSII or OASIS, which contains a description of the actual geometric shapes that are to be printed on the wafer. In between the two ends of the IC design flow, the IC design may be represented in numerous data formats or languages that describe the same IC design at different levels of abstraction.

Some examples of IC design steps and the associated software tools are described below. These examples are for illustrative purposes only and are not intended to limit the embodiments to the forms disclosed. This disclosure describes embodiments that can be used in one or more IC design steps.

IC design software tools enable IC designers to describe the functionality that the IC designers want to implement. These tools also enable IC designers to perform what-if planning to refine functionality, check costs, etc. During logic design and functional verification, the HDL, e.g., SystemVerilog, code can be written and the design can be checked for functional accuracy, e.g., the design can be checked to ensure that it produces the correct outputs.

During synthesis and design for test, the HDL code can be translated to a netlist using one or more IC design software tools. Further, the netlist can be optimized for the target technology, and tests can be designed and implemented to check the finished chips. During netlist verification, the netlist can be checked for compliance with timing constraints and for correspondence (i.e., equivalence checking) with the RTL design and/or HDL code.

During design planning, an overall floorplan for the chip can be constructed and analyzed for timing and top-level routing. During physical implementation, circuit elements can be positioned in the layout and can be electrically connected.

During analysis and extraction, the IC design's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Overview

Formal logical equivalence checkers prove that the netlist a synthesis tool creates is logically equivalent to its original RTL design. As explained above, in existing approaches, equivalence checking must run after synthesis is complete, reading the original RTL design and the derived netlist, and verifying their equivalence. Synthesis tools may also produce a "guidance" file that gives the equivalence checker hints about optimizations it performed to improve the tractability of the equivalence checking problem, which is NP-complete. Such guidance improves the equivalence checker's ability to complete the verification.

Some embodiments described herein comprise two components that together improve equivalence checking completion and time to results. Specifically, in some embodiments, a synthesis tool writes intermediate checkpoint designs that embody the state of the design under synthesis as optimization progresses. Meanwhile, formal equivalence checking proceeds in parallel with synthesis and checks the intermediate checkpoint designs for equivalence.

Specifically, one implementation can be as follows: (1) at start of compile, a synthesis tool invokes a formal logic equivalence checker, (2) the synthesis tool writes intermediate checkpoint designs (and any additional information, e.g., guidance) as optimization progresses, (3) in parallel with ongoing synthesis and optimization, the formal logic equivalence checker reads each checkpoint design (and any additional information, e.g., guidance) as it is written or outputted, and verifies its equivalence to the previous checkpoint design (or original RTL design in the case of the first intermediate checkpoint design), and (4) at end of compile, the synthesis tool writes the final netlist and the formal logic equivalence checker verifies its equivalence to the last checkpoint design. This concurrent approach verifies the final netlist's equivalence to the original RTL by inference. Each checkpoint verification and the final verification are more tractable (i.e., require less computation) than the RTL-to-final-netlist verification would be, because the designs are more similar to each other. Moreover, formal equivalence checking completes quickly after synthesis.

Some embodiments described herein provide techniques and systems for checking logical equivalence between an RTL design and a netlist that is created by a synthesis tool by synthesizing the RTL design. Specifically, in some embodiments, (1) an RTL design can be received by a synthesis tool executing on a first processing mechanism, (2) a final netlist can be created by the synthesis tool based on the RTL design, wherein the synthesis tool creates one or more intermediate checkpoint designs before creating the final netlist, and wherein the synthesis tool provides the intermediate checkpoint designs to a formal logic equivalence checking tool that is executing in parallel on a second processing mechanism, and (3) the formal logic equivalence checking tool can formally verify functional equivalence between: (i) the RTL design and an intermediate checkpoint design, (ii) two intermediate checkpoint designs, or (iii) an intermediate checkpoint design and the final netlist.

Concurrent Formal Verification of Logic Synthesis

Figure 2A:
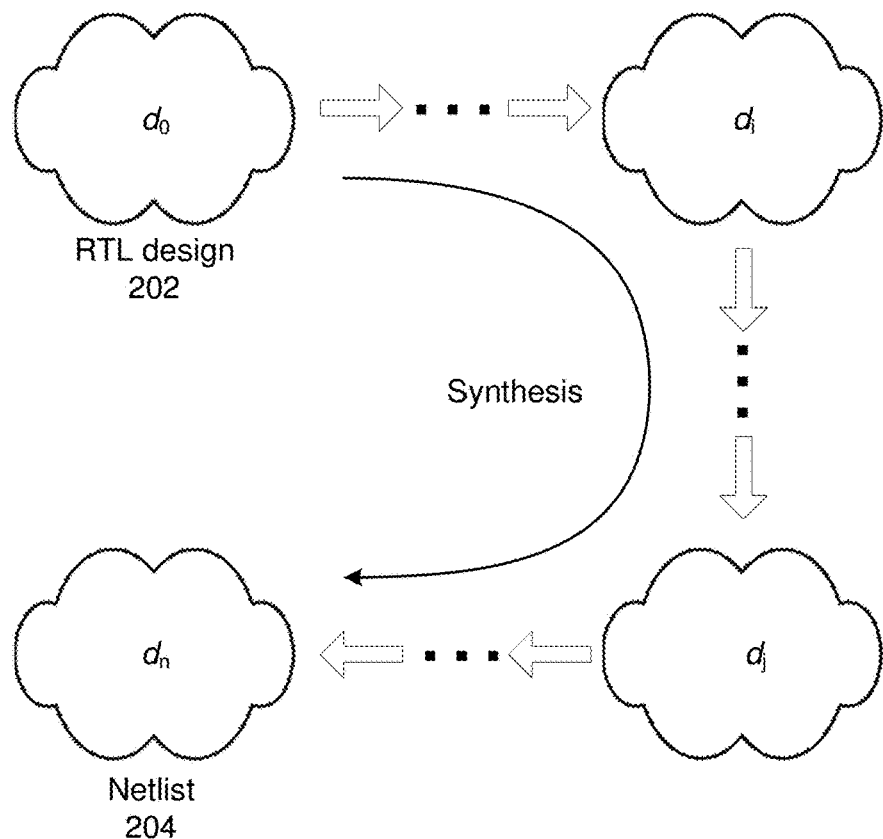
FIGS. 2A and 2B illustrate concurrent formal verification of logic synthesis in accordance with some embodiments described herein.
Figure 2B:
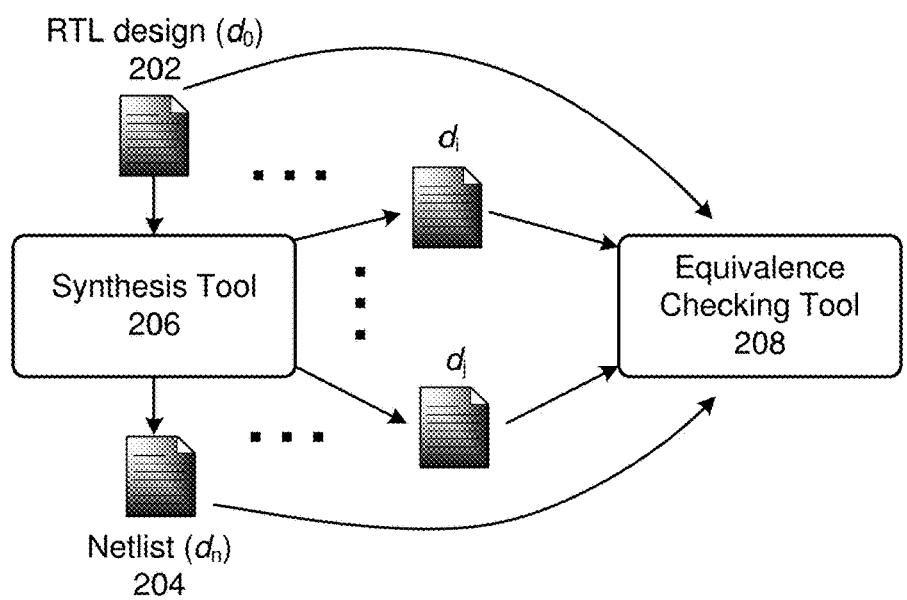

FIGS. 2A and 2B illustrate concurrent formal verification of logic synthesis in accordance with some embodiments described herein. RTL design 202 can be synthesized to produce netlist 204. In some embodiments described herein, multiple intermediate checkpoint designs can be outputted during synthesis. Specifically, as shown in FIG. 2A, RTL design 202 is the initial design $d_0$, netlist 204 is the final design $d_n$, and designs $d_i$ and $d_j$, where $1 \leq i < j \leq n$, are intermediate checkpoint designs. An intermediate checkpoint design $d_i$ can be checked for equivalence against (1) the original RTL design $d_0$, (2) another intermediate checkpoint design $d_j$, or (3) the final netlist $d_n$.

As shown in FIG. 2B, synthesis tool 206 can receive RTL design $d_0$ as an input, and output a sequence of intermediate checkpoint designs, e.g., $d_i, \ldots, d_j$, while performing synthesis, and finally output netlist $d_n$ when synthesis is completed. Equivalence checking tool 208 can receive, as input, any two of the following IC design representations: the original RTL design $d_0$, the intermediate checkpoint designs $d_i, \ldots, d_j$, and the final netlist $d_n$. Next, equivalence checking tool 208 can check equivalence between the two IC design representations.

Specifically, equivalence checking tool 208 can execute concurrently with respect to synthesis tool 206. For example, synthesis tool 206 can output intermediate checkpoint design $d_i$ after performing a set of synthesis operations, and continue performing additional synthesis operations to further transform and/or optimize the IC design. After synthesis tool 206 has outputted intermediate checkpoint design $d_i$, and while synthesis tool 206 is performing further synthesis operations, equivalence checking tool 208 can concurrently check equivalence between RTL design $d_0$ and intermediate checkpoint design $d_i$. Subsequently, when synthesis tool 206 outputs another intermediate checkpoint design $d_j$, equivalence checking tool 208 can concurrently check equivalence between intermediate checkpoint designs $d_i$ and $d_j$. Finally, when synthesis tool 206 outputs netlist $d_n$, equivalence checking tool 208 can check equivalence between an intermediate checkpoint design and the final netlist $d_n$. Specifically, in some embodiments, as the synthesis tool is outputting IC designs $d_i$, $1 \leq i \leq n$, the equivalence checking tool concurrently checks equivalence between IC designs $d_i$ and $d_{i-1}$.

If equivalence checking tool 208 determines that the two designs are not equivalent, then equivalence checking tool 208 can report the failure, and a user can take appropriate actions to correct the problem. Corrective actions include, but are not limited to, modifying the RTL design and/or changing the number and/or type of transformations/optimizations that are performed during synthesis. In some embodiments, the corrective action can be to continue synthesis and attempt proving equivalence with the next intermediate checkpoint design. For example, if equivalence checking between intermediate checkpoint designs $d_i$ and $d_j$ fails, then the process can allow synthesis to continue, and attempt to prove equivalence between intermediate checkpoint designs $d_i$ and $d_{j+1}$ once the intermediate checkpoint design $d_{j+1}$ becomes available. On the other hand, if all equivalence checks succeed, then netlist 204 can undergo subsequent steps in the IC design flow to result in IC chips.

In embodiments described herein, the wall clock time (i.e., the time from which synthesis starts to the time when verification ends) required to synthesize a netlist from an RTL design, and to check equivalence by inference between the RTL design and the netlist is substantially less than existing approaches because equivalence checking is performed concurrently with logic synthesis. After the final netlist $d_n$ is outputted, some embodiments described herein only need to check equivalence between intermediate checkpoint design $d_{n-1}$ and the final netlist $d_n$, which takes significantly less time than checking equivalence between initial RTL design $d_0$ and final netlist $d_n$.

Note that it is not obvious to perform equivalence checking concurrently with logic synthesis. Requiring the synthesis tool to write intermediate checkpoint designs increases the amount of computational time and resources required by the synthesis tool to produce a netlist based on an RTL design. Embodiments disclosed herein are based on the following non-obvious insight: the increase in the computational time and resources for writing intermediate checkpoint designs is more than offset by the amount of time saved by concurrently performing equivalence checking.

Figure 3:
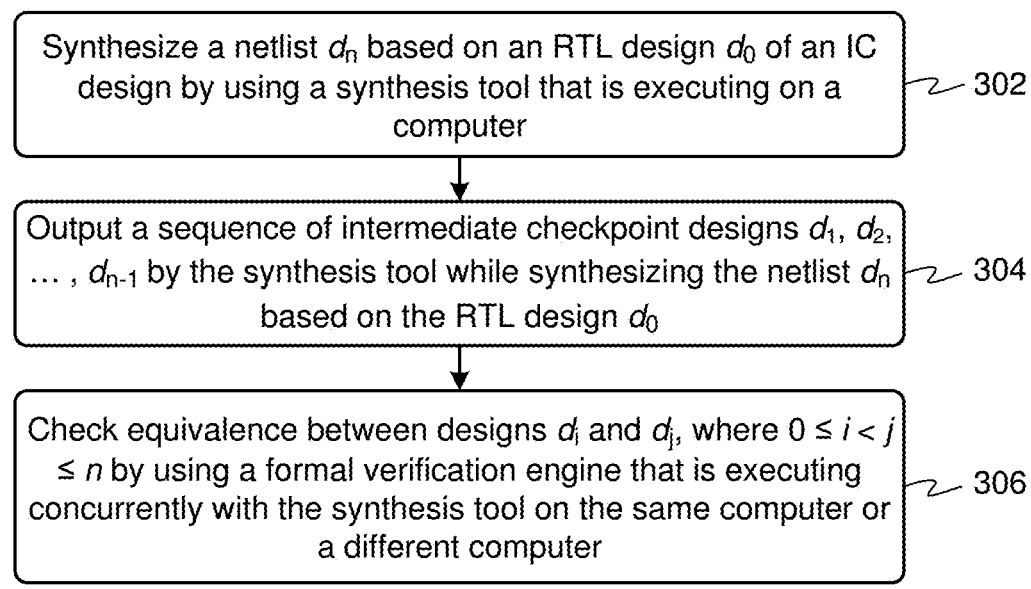
FIG. 3 illustrates a process for performing concurrent formal verification of logic synthesis in accordance with some embodiments described herein.

FIG. 3 illustrates a process for performing concurrent formal verification of logic synthesis in accordance with some embodiments described herein. The process can begin by synthesizing a netlist design $d_n$ based on an RTL design $d_0$ of an IC by using a synthesis tool executing on a computer (step 302). A sequence of intermediate checkpoint designs $d_1, d_2, \ldots, d_{n-1}$ can be outputted by the synthesis tool while synthesizing the netlist $d_n$ based on the RTL design $d_0$ (step 304). The process can then check equivalence between designs $d_i$ and $d_j$, where $0 \leq i < j \leq n$ by using a formal verification engine that is executing concurrently with the synthesis tool on the same computer or a different computer (step 306).

Note that an intermediate checkpoint design is not an RTL design, nor is it a final netlist. In some embodiments, an intermediate checkpoint design is a structural netlist, but it may not be completely mapped to a specific technology library as a final netlist is. An intermediate checkpoint design may refer to generic technology library ("GTECH") models, and it may refer to completely unimplemented RTL operator blocks (arithmetic operators such as adders, multipliers, etc., or generic mux operators) that have no internal content. The equivalence checking tool must interpret such operator blocks as if they were RTL. The intermediate checkpoint design may also include references to a generic sequential primitive ("SEQGEN"), inferred from RTL but not yet mapped to a real register model.

In some embodiments, certain design-related data can be copied forward across intermediate checkpoint designs, i.e., if the data is created while generating design $d_i$, then the data can be copied forward to designs $d_j$, where $j > i$. Specifically, three types of data can be created and copied forward in this manner:

(1) Metadata. Expression strings defining the word-level functions of arithmetic operators are derived when the logic synthesis tool generates guidance for the equivalence tool. These strings are attached to specific operator blocks. When a subsequent checkpoint is encountered, they can be carried forward from the pre-checkpoint reference design to the checkpoint, for use in subsequent guidance processing. In some embodiments, a data-flow graph specifying the operators and connectivity can be created to facilitate equivalence checking. Specifically, such data-flow graphs may be needed to describe more complex data-paths which would be too cumbersome to describe by using only string expressions.

(2) Real data. In some cases, a checkpoint may include arithmetic operator blocks that have been implemented, but the implementation is not friendly to subsequent guidance processing. In these cases, the equivalence checking tool discards the internals of the operator in the intermediate checkpoint design and replaces it with its own, friendlier, implementation. Specifically, the real data can include a second implementation of an operator that replaced a first implementation of the operator, wherein the second implementation requires less computation to check equivalence than the first implementation (that is why it is called a "friendlier" implementation).

(3) User setup data. If user set-up commands, for example forcing a certain signal to a constant value, have been applied to the original RTL design, then such set-up commands can be carried forward across each checkpoint.

Computer System

Figure 4:
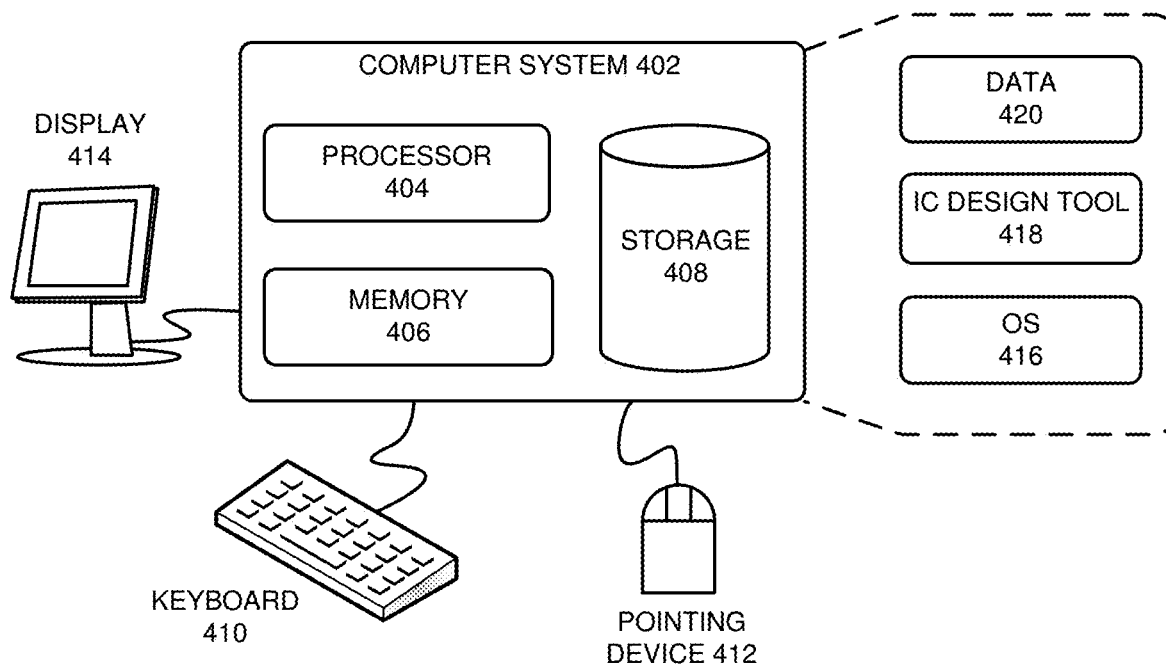
FIG. 4 illustrates a computer system in accordance with some embodiments described herein.

The term "computer" or "computer system" generally refers to a hardware-based system that can perform computations required for the design and manufacture of ICs. FIG. 4 illustrates a computer system in accordance with some embodiments described herein. Computer system 402 can include processor 404, memory 406, and storage device 408. Computer system 402 may include multiple processors, and processor 404 may include multiple cores. Specifically, memory locations in memory 406 can be addressable by processor 404, thereby enabling processor 404 to access (e.g., via load/store instructions) and manipulate (e.g., via logical/floating point/arithmetic instructions) the data stored in memory 406. Computer system 402 can be coupled to display device 414, keyboard 410, and pointing device 412. Storage device 408 can store operating system 416, IC design tool 418, and data 420. Data 420 can include input required by IC design tool 418 and/or output generated by IC design tool 418.

Computer system 402 may automatically (or with user help) perform one or more operations that are implicitly or explicitly described in this disclosure. Specifically, computer system 402 can load IC design tool 418 into memory 406, and IC design tool 418 can then be used to produce a synthesized IC design, wherein the IC design tool 418 can perform equivalence checking concurrently while producing the synthesized IC design. Specifically, IC design tool may include a synthesis tool and a formal verification engine that are executed on separate computer systems, or separate processors of the same computer system, or separate cores of the same processor. When the synthesized IC design is manufactured, the resulting IC chips contain the synthesized IC design which was formally verified using techniques and systems described herein.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A non-transitory computer-readable storage medium storing instructions that, when executed by a computer, cause the computer to perform a method for concurrently performing formal verification during logic synthesis, the method comprising:

synthesizing a netlist design $d_n$ based on a Register Transfer Level (RTL) design $d_0$ of an integrated circuit (IC) by using a synthesis tool executing on a computer;

outputting a sequence of intermediate checkpoint designs $d_1, d_2, \ldots, d_{n-1}$ by the synthesis tool while synthesizing the netlist $d_n$ based on the RTL design $d_0$; and checking equivalence between designs $d_i$ and $d_j$, where $0 \leq i < j \leq n$ by using a formal verification engine that is executing concurrently with the synthesis tool on the same computer or a different computer.

2. The non-transitory computer-readable storage medium of claim 1, wherein at least one intermediate checkpoint design is a structural netlist that is not completely mapped to a specific technology library.

3. The non-transitory computer-readable storage medium of claim 2, wherein the intermediate checkpoint design refers to generic technology library models.

4. The non-transitory computer-readable storage medium of claim 2, wherein the intermediate checkpoint design includes at least one unimplemented RTL operator block.

5. The non-transitory computer-readable storage medium of claim 2, wherein the intermediate checkpoint design includes at least one generic sequential primitive.

6. The non-transitory computer-readable storage medium of claim 1, wherein said outputting the sequence of intermediate checkpoint designs comprises copying forward at least one of: metadata, real data, and user setup data.

7. The non-transitory computer-readable storage medium of claim 6, wherein the metadata comprises expression strings defining word-level functions of arithmetic operators.

8. The non-transitory computer-readable storage medium of claim 6, wherein the metadata comprises data-flow graphs specifying operators and connectivity.

9. The non-transitory computer-readable storage medium of claim 6, wherein the real data comprises a second implementation of an operator that replaced a first implementation of the operator, wherein the second implementation requires less computation to check equivalence than the first implementation.

10. The non-transitory computer-readable storage medium of claim 6, wherein the user setup data comprises a command that forces a signal to a constant value.

11. A method for concurrently performing formal verification during logic synthesis, the method comprising:
- synthesizing a netlist design $d_n$ based on a Register Transfer Level (RTL) design $d_0$ of an integrated circuit (IC) by using a synthesis tool executing on a computer;
- outputting a sequence of intermediate checkpoint designs $d_1, d_2, \ldots, d_{n-1}$ by the synthesis tool while synthesizing the netlist $d_n$ based on the RTL design $d_0$; and
- checking equivalence between designs $d_i$ and $d_j$, where $0 \leq i < j \leq n$ by using a formal verification engine that is executing concurrently with the synthesis tool on the same computer or a different computer.

12. The method of claim 11, wherein at least one intermediate checkpoint design is a structural netlist that is not completely mapped to a specific technology library.

13. The method of claim 12, wherein the intermediate checkpoint design refers to generic technology library models.

14. The method of claim 12, wherein the intermediate checkpoint design includes at least one unimplemented RTL operator block.

15. The method of claim 12, wherein the intermediate checkpoint design includes at least one generic sequential primitive.

16. The method of claim 11, wherein said outputting the sequence of intermediate checkpoint designs comprises copying forward at least one of: metadata, real data, and user setup data.

17. The method of claim 16, wherein the metadata comprises expression strings defining word-level functions of arithmetic operators.

18. The method of claim 16, wherein the metadata comprises data-flow graphs specifying operators and connectivity.

19. The method of claim 16, wherein the real data comprises a second implementation of an operator that replaced a first implementation of the operator, wherein the second implementation requires less computation to check equivalence than the first implementation.

20. The method of claim 16, wherein the user setup data comprises a command that forces a signal to a constant value.

21. An apparatus, comprising:
- a processor; and
- a non-transitory computer-readable storage medium storing instructions that, when executed by the processor, cause the processor to perform a method for concurrently performing formal verification during logic synthesis, the method comprising:
  - synthesizing a netlist design $d_n$ based on a Register Transfer Level (RTL) design $d_0$ of an integrated circuit (IC) by using a synthesis tool executing on a computer;
  - outputting a sequence of intermediate checkpoint designs $d_1, d_2, \ldots, d_{n-1}$ by the synthesis tool while synthesizing the netlist $d_n$ based on the RTL design $d_0$; and
  - checking equivalence between designs $d_i$ and $d_j$, where $0 \leq i < j \leq n$ by using a formal verification engine that is executing concurrently with the synthesis tool on the same computer or a different computer.

\* \* \* \* \*